United States Patent
Frink

[11] 3,959,577
[45] May 25, 1976

[54] HERMETIC SEALS FOR INSULATING-CASING STRUCTURES

[75] Inventor: Russell E. Frink, Forest Hills, Pa.

[73] Assignee: Westinghouse Electric Corporation, Pittsburgh, Pa.

[22] Filed: June 10, 1974

[21] Appl. No.: 478,141

[52] U.S. Cl............................ 174/50.5; 174/50.61; 200/148 B
[51] Int. Cl.² ........................................ H05K 5/06
[58] Field of Search............ 174/50.5, 50.61, 50.63; 200/144 R, 145, 148 R, 148 A, 148 B, 148 G, 150 G, 150 B

[56] References Cited
UNITED STATES PATENTS
2,981,814  4/1961  Friedrich ...................... 200/145 X
3,163,736  12/1964  Mikos et al. ...................... 200/145

Primary Examiner—J. V. Truhe
Assistant Examiner—David A. Tone
Attorney, Agent, or Firm—W. R. Crout

[57] ABSTRACT

Improved hermetic seals for casing structures, particularly applicable for insulating-casing structures utilized in connection with gas-type piston-flow circuit-interrupters, are provided including end metallic closure-plate members, which are hermetically sealed in a gas-tight manner to the ends of generally-tubular, or cylindrically-shaped insulating-casing structures, such as porcelain casings, for example.

In some embodiments of the invention, an internally-located ring-shaped, mounting-flange member, or adapter ring, is secured, as by a cemented, or babbitted construction, to the inner internal end surface of the insulating-casing structure, and suitable hermetic sealing means are provided for attaching the metallic end closure plate member to this internally-disposed supporting-flange, or adapter member.

In other embodiments of the invention, there is provided an externally-located supporting ring-shaped flange-member cemented, or babbitted to an end portion externally of the tubular insulating casing member, and in this particular instance, the end metallic closure plate member may be secured, as by a bolted connection, to such externally-disposed flange-member, with, preferably, a gasket and a solder-sealed ring-shaped mounting member, the latter being affixed, as by a soldered connection, to such end metallic closure-plate member.

11 Claims, 7 Drawing Figures

HERMETIC SEALS FOR INSULATING-CASING STRUCTURES

CROSS-REFERENCES TO RELATED APPLICATIONS

Applicant is not aware of any related patent applications pertinent to the hermetic-sealing constructions set forth in the instant patent application.

BACKGROUND OF THE INVENTION

In electrical equipment, which is insulated with a gas other than air, it is sometimes desirable to seal the gas within the device with a fused, inorganic seal. The problem is comparatively easy when the device is housed within a metallic tank, which can be welded, or brazed closed, and electrical connections with the interior parts made through bushings, which can be solder-sealed, or brazed into place. However, when it is desired to seal the device within a porcelain tube, for example, with metallic ends, the problem is then somewhat more difficult, especially when relatively high internal gas pressures are encountered.

In U.S. Pat. No. 3,163,736, issued Dec. 29, 1964, entitled "High-Voltage Gas-Type Circuit Interrupter," to J. J. Mikos et al, there is shown a method for making such a hermetic seal. However, the Mikos et al Patent relates to an outdoor device, and excess diameter is not a problem. For use in metal-clad switchgear, where space is at a premium, it is desirable to find a very compact sealing construction, and one which will maintain its hermetic sealing gas-tight condition over long operational periods of time.

In a gas-type puffer-type circuit-interrupter construction, such as set forth in U.S. patent application filed May 13, 1974, Ser. No. 469,586, by Stanislaw A. Milianowicz, entitled "Improved Puffer-Type Gas Circuit-Interrupter", there is illustrated and described a sealed-casing circuit-interrupter tube formed of porcelain, and having separable contact structure disposed therewithin. The porcelain casing is partially filled with a highly-efficient arc-extinguishing gas, such as sulfur-hexafluoride ($SF_6$) gas, for example. The pressure, internally of such an interrupter-casing construction, may, for example, be several atmospheres, for instance 70 p.s.i. During arcing conditions, this internal pressure may be increased considerably by the heat of the arc, and it is desirable to provide an end metallic closure plate member, which will be fixedly maintained in place, and yet will provide a hermetic gas-tight seal to the tubular insulating porcelain-casing structure to maintain the internal gas pressure therein without leakage occurring, which would, of course, permit the extinguishing gas, such as $SF_6$ gas, for example, to escape to the surrounding atmosphere. According to accepted definitions, any seal which is air-tight is a "hermetic seal." However, in this disclosure, the term "hermetic seal" will be limited to include only fusion seals, such as glass-to-metal, solder seals, and brazed or welded joints.

SUMMARY OF THE INVENTION

According to the present invention, there is provided an improved hermetic-seal construction for a tubular casing structure, such as a porcelain tube, for example, which will maintain its leak-tight condition over long periods of time, even though the internal pressure may rise from any cause, such as arcing conditions. This is accomplished by the use of an internally-disposed supporting adapter flange-ring, cemented adjacent the internal end surface of the casing structure, and then an end-plaate closure-member is either bolted, or threadedly secured to such internally-disposed adapter ring-shaped flang-member. The internal adapter flange-member may be cemented, or babbitted into position, and the end-closure plate member may be provided, additionally, with a solder-ring-shaped sealing member having an edge flange portion with the edge thereof turned over, somewhat generally parallel with the end external surfaces of the porcelain casing. Then a suitable sealing compound, such as solder, for example, may be provided therebetween to effect a leak-tight seal. Additionally, a suitable resilient gasket may be provided at the extreme end of the casing member interposed between the end metallic closure-plate member and the extreme end of the porcelain casing structure.

In another embodiment of the invention, there is provided an externally-located supporting-flange adapter member cemented, or babbitted to an outside external portion of the porcelain casing member, and the end-closure plate member may be bolted to such externally-provided supporting-flange adapter member. Again a solder sealing-ring construction may be utilized in conjunction with the end metallic closure-plate member, and such solder sealing member may again be soldersealed to the external end surface of the casing structure.

In still another embodiment of the invention, an end-closure metallic plate member may have one or more filling holes provided therein, through which a cemented composition, such as babbit metal, for example, may be poured to thereby hermetically secure an inwardly-extending flange-portion of such end-closure plate member into the internal end of the porcelain casing structure. Following this operation, one or more soldered plugs may be secured in said one or more filling holes provided in the metallic plate member, and again a surrounding solder sealing ring may be provided and solder-sealed to the external end surfaces of the porcelain casing structure. Preferably, again a gasketed construction may be utilized bearing against the extreme end of the porcelain casing structure.

In still another embodiment of the invention, the end-metallic closure-plate member may be secured by a plurality of mounting bolts into the end of the internally-located supporting adapter flange-member, with the shoulders of the heads of the bolts solder-sealed to the bolt holes provided in the end-closure plate to prevent gas leakage, and to thereby provide a hermetic seal. Again, the externally-provided solder-sealing ring may be utilized to advantage, again being solder-sealed to the outer external end surface of the porcelain casing structure. A resilient gasket may additionally be employed, as before, bearing against the extreme end surface of the porcelain casing structure.

DESCRIPTION OF THE PREFERRED EMBODIMENTS

In electrical equipment which is insulated with a gas other than air, it is sometimes desirable to seal the gas in the device with a fused, inorganic seal. The problem is comparatively easy when the device is housed in a metallic tank which can be welded, or brazed closed and electrical connections with the interior parts made through bushings which can be solder-sealed or brazed into place. However, when it is desired to seal the device in a porcelain tube with metallic ends, the problem is somewhat more difficult, especially when relatively high pressures are encountered.

In U.S. patent application filed May 13, 1974, Ser. No. 469,586 by Stanislaw A. Milianowicz, there is illustrated a sealed-casing construction enclosing a pair of separable contacts and a piston-assembly operated by a movable contact-operating rod, the latter being sealed by a sylphon bellows, and extending out of an opening provided in the end-closure plate of the interrupter-casing structure. Reference may be made to this patent application for a particular application of the improved hermetic sealing constructions set forth in the present patent application.

Also, reference may be made to U.S. patent application filed May 14, 1974, Ser. No. 469,932, by Russell E. Frink, entitled "Improved Motion-Multiplying Linkage Mechanism For Sealed-Casing Structures", both of the foregoing patent applications being assigned to the assignee of the instant patent application.

It will be obvious from the aforesaid two U.S. patent applications, that in a circuit-interrupter of the type utilizing a piston-operated gas-puffer device in which a blast of piston-generated flow of gas is directed into the arc, that it is desirable to provide hermetic seals at the ends of the casing structure to ensure that the pressurized gas, contained within the casing structure, will not leak out of the casing over long operational periods of time, say, for example, 15 years.

It is, accordingly, desirable to provide an improved hermetic sealing arrangement which will maintain a leak-tight condition over long periods of time, and, very importantly, will withstand the momentary high internal gas pressures, which may be in existence during arcing conditions occurring within the casing during circuit interruption.

Figure 1:
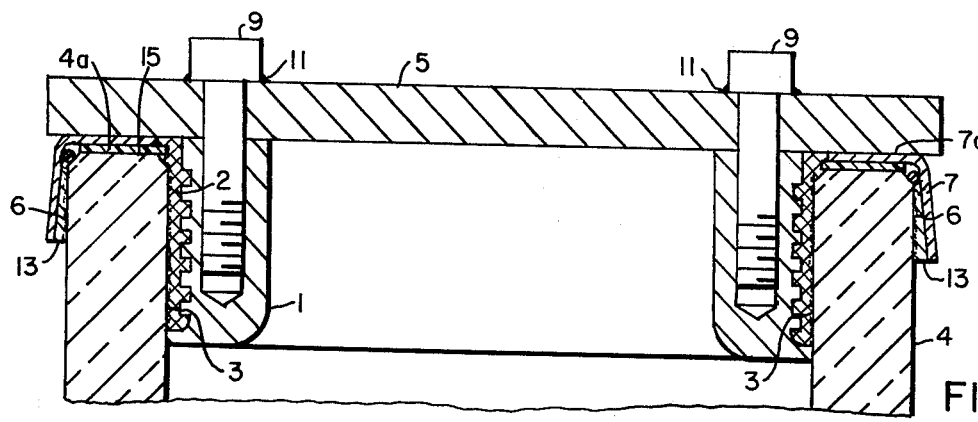
FIG. 1 illustrates one embodiment of the invention in which the end-metallic closure-member may be secured, as by a bolted connection, to an internally-disposed mounting-adapter flange member, the latter constituting a separate entity.

FIG. 1 illustrates one hermetic seal construction of the invention in which an adapter ring 1 is babbitted at 2 to the internal sand band 3 provided internally of a porcelain casing 4.

In order to attach the flange 1 to the porcelain cylinder 4 with Portland cement, or sulfur base cement 2, it is necessary to roughen the inner surface of the porcelain casing 4 in the area of flange attachment 1. The most common method of accomplishing this is to use a sanded surface attached to the porcelain surface with glaze.

FIG. 1 fragmentarily illustrates in section, the cemented attachment 2 of the metallic end ring 1 with the inner portion of the porcelain casing 4. As well known by those skilled in the art, he adapter casting 1 may be securely fastened to the inner surface of the porcelain casing 4 by Mineralead cement 2, a high melting point sulfur cement, which contains no corrosive constituents.

The formulation of the Mineralead cement 2 is as follows:

| Material: | Content, percent |
|---|---|
| Refined sulfur, min. | 55 |
| Inert Aggregate | 35–45 |
| Plasticizer max.[1] | 3 |

[1]NOTE — Suitable non-volatile plasticizer in sufficient quantity so that cement conforms to requirement of this specification.

INERT AGGREGATE COMPOSITION

The chemical composition of the inert aggregate shall conform to the following:

| Chemical: | Content, percent |
|---|---|
| Carbon | 1.0 to 2.0 |
| $SiO_2$ | 97.0 to 98.5 |
| $Al_2O_3$ | 0.3 to 0.7 |
| $Fe_2O_3$ | 0.1 to 0.5 |
| CaO | None |
| MgO | None |
| $K_2O$ | None |
| $Na_2O$ | None |
| NaCl or other inorganic halides | None |

Instead of Mineralead 2, a Portland cement could be used in the cemented casing construction.

This cement 2 has been found to be extremely strong, as shown by cantilever strength tests, and preferably contains a plasticizer, which prevents mechanical stresses.

With regard to the platinum layer, or band 6, reference may be had to the teachings of U.S. Pat. No. 1,852,093, issued Apr. 5, 1932 to Smede et al., and the teachings of this patent are hereby incorporated in the instant application by reference.

The end metallic cover 5 has the solder ring 7 brazed to it at 7a, and the cover 5 is then bolted to the adapter ring 1 by the bolts 9. Preferably, an annular gasket 15 of a suitable material such as "Teflon" or "Neoprene" is interposed between the end metallic closure plate 5 and the end surfaces 4a of the porcelain casing 4. After these mounting bolts 9 are tightened, they are soldered to the end metallic cover 5, as at 11. The solder ring 7 is then soldered to the platinum band 6 at 13.

Figure 2:
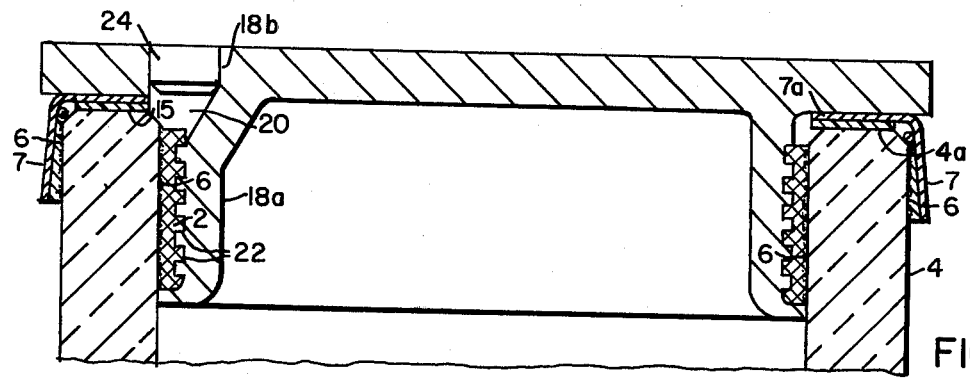
FIG. 2 illustrates another embodiment of the invention in which an end-closure metallic-member has filling holes provided therein, and is secured by an internally-extending integral flange-portion to the internal end of the porcelain casing structure.

With reference to FIG. 2 of the drawings, it will be observed that there is again provided a casing structure, such as the porcelain tube 4, which has the platinum band 6 fused into the glaze. A metallic closure cover 18 has the spun solder ring 7 brazed to its underside, as shown at 7a. A gasket 15 is placed against the end 4a of the porcelain tube 4, and pressure is applied. The assembly is heated and babbit 2 is poured through the filling holes 20, which are spaced around the periphery of the end metallic cover 18. When the babbit 2 freezes between the sand band 3 and the grooves 22 in the extension 18a of the cover 18, the cover 18 is securely locked into the end of the porcelain tube 4. Plugs 24 are then screwed into the tapped holes 18b and sealed with solder. The assembly is then inverted and the solder ring 7 is soldered to the platinum band 6, thereby producing a gas-tight hermetic seal.

Both ends of the procelain tube 4, may, if desired, be closed in the manner set forth above. The tube 4 may then be utilized to house circuit-interrupter contacts 31 in the manner set forth in FIG. 6 in the aforesaid patent applications Ser. No. 469,586, and Ser. No. 469,932.

Figure 3:
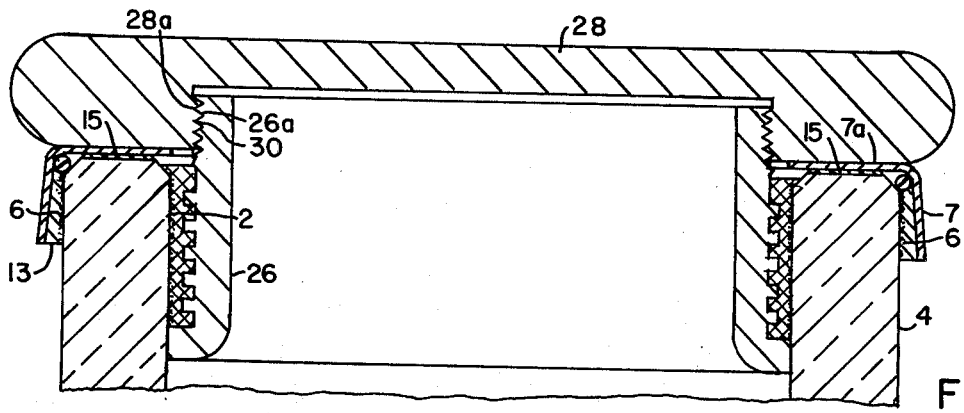
FIG. 3 illustrates an alternate form of the invention in which the internal supporting adapter flange-ring extends somewhat outwardly, and the end-closure plate member has a threaded connection therewith.

In the modified-type of hermetic seal construction set forth in FIG. 3 of the drawings, it will be apparent that the metallic supporting adapter collar 26 may be babbitted at 2 to the external shoulder-portion of the casing structure 4. The end metallic ring 7 may be brazed at 7a to the end metallic closure member 28, and soldered at 13 to the porcelain casing 4 to provide a fusion-type hermetic seal. As shown, the extremities of the tubular metallic members 26 are threaded at 26a and screwed at 30 to these tubular members 26 are the end closure members 28, which resist the internal force resulting from pressure present within the porcelain casing 4. A gasket 15 may be interposed between a boss portion of the end-closure plate 28 and the end extremity surfaces 4a of the porcelain-casing structure 4, as shown in FIG. 3. The metallic collar 26 provides a rigid securement to the end-closure plate 28. A solder-sealed connection 13 may be provided between the internal surface of the brazing ring 7 and the outer platinum band surface 6 of the porcelain-casing structure 4.

Referring to FIG. 4, there is again shown the porcelain tube 4. Member 26a is a tubular metal collar adapter member attached to the inside surface of the porcelain casing 4 by babbitt 2. The upper end of collar 26a is threaded as at 30, to the metallic end cap 28a. Annular solder ring 7 is a relatively-thin metallic ring, which is brazed to cover 28a as at 7a. Assembly is as follows. The tubular member 26a is babbitted into the porcelain tube 4. Cover 28a is then screwed onto 26a and tightened so that the end of the porcelain 4 bears against the gasket 15. Hermetic sealing is then accomplished by soldering the ring 7 to the metallic glaze 6 with the solder fillet 13, which is a conventional metal-to-porcelain seal.

Figure 4:
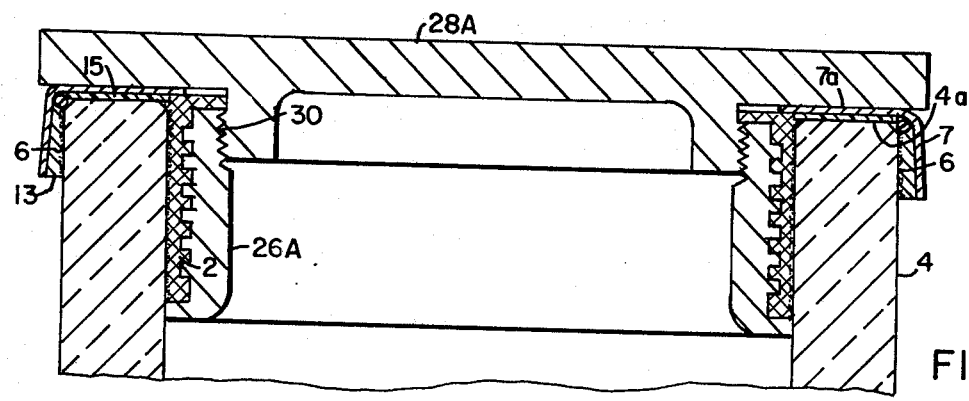
FIG. 4 illustrates still a further embodiment of the invention wherein the end-metallic closure-plate has an internally-extending threaded supporting portion, the latter being threadedly secured to the internally-disposed adapter mounting-flange ring.

The versions shown in FIGS. 3 and 4 are similar except for the manner of threading the cover to the adapter ring 26 or 26a. Either version may find application depending on detail features of the design. The following improvements have been made:

1. The soldered joints at 11 of FIG. 1 and 18b of FIG. 2 have been eliminated which improves the reliability.
2. Manufacturing is simplified.

Figure 5:
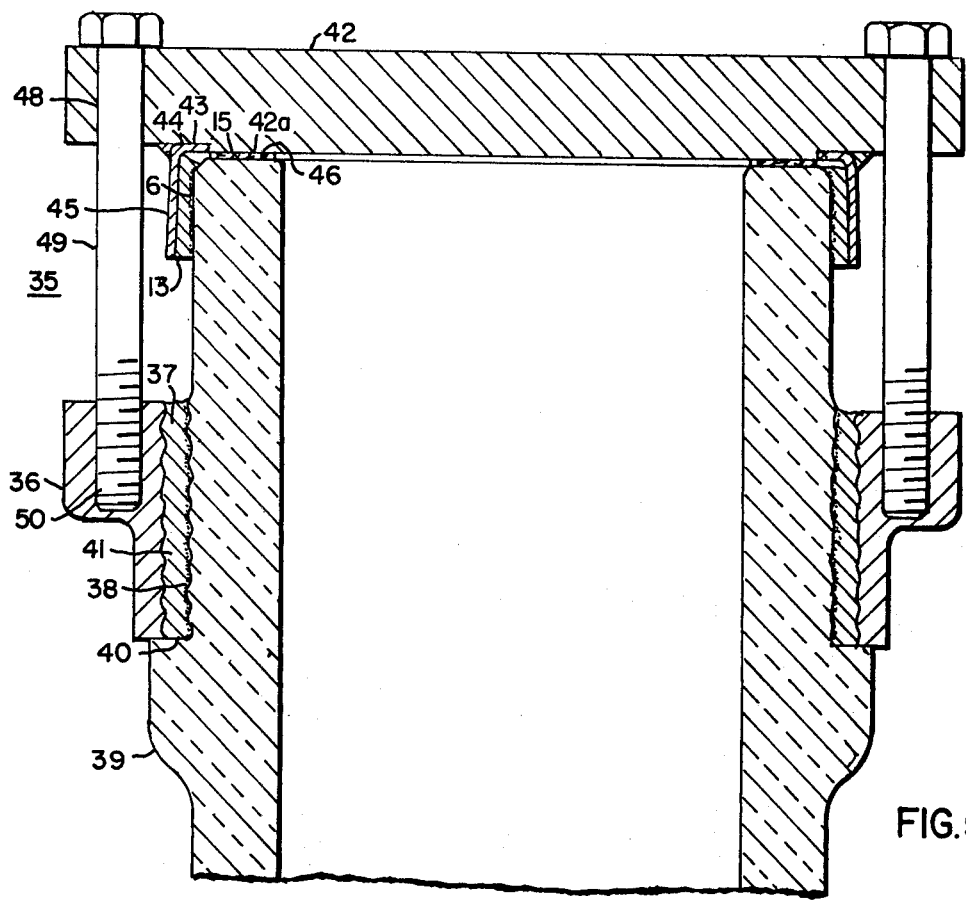
FIG. 5 illustrates an alternate form of the invention, in which the end-metallic closure-plate is secured by externally-disposed mounting bolts to an outer supporting adapter flange-ring, the latter being cemented, or babbitted to the outer external surface of the insulating porcelain casing structure.

FIG. 5 illustrates an alternate construction 35 in which the metallic collar adapter ring 36 is cemented, or babbitted at 37 to the sand-layer 38 provided on the external surface of the porcelain casing 39. It will be observed that the porcelain casing 39 has a shoulder portion 40, which prevents the babbitt 37 from leaking out the annular area 41 during the babbitting operation.

The end metallic cover member 42 has a downwardly-extending shoulder portion 43 to which is brazed, as at 44, the solder ring 45. Again, a gasket 15 is employed bearing upon the end 46 of the porcelain casing 39, and also bearing against the lower surface of the end closure member 42. The end closure member 42 is provided with a plurality of peripherally spaced mounting holes 48, through which mounting bolts 49 extend, and are threadably secured into suitable tapped holes 50 provided circumferentially around the externally-located adapter ring 36. Again, upon inverting the casing assembly, a solder fillet 13 may be formed between the solder-ring 45 and the platinum band 6, previously provided externally on the end of the porcelain casing 39. It will be obvious, therefore, that tightening the mounting bolts 49 will effect a compression of the gasket 15, this action taking place prior, of course, to the subsequent soldering operation between the platinum band 6 and the solder ring 45.

In more detail with reference to FIG. 5 of the drawings, it will be observed that in this embodiment of the invention a ring-shaped adapter 36 is babbitted to an externally-provided sand band 38 provided on the outside surface of the porcelain casing 39. To facilitate the admission of babbit metal into the space between the internal surface of the adapter ring 36 and the external surface of the porcelain casing, the porcelain casing 39, is fabricated with the shoulder portion 40 so that when the metallic babbit is poured into the annular recess 41, the babbit metal will be captivated and will be retained therein.

As in some of the other embodiments, a solder ring 45 is affixed, as by brazing, to the lower surface of the end metallic closure plate 42. In this particular embodiment, however, the end closure plate 42 is provided with a plurality of peripherally-spaced mounting holes 48, through which the plurality of mounting bolts 49 extend and are threadedly secured into the externally-provided adapter ring 36, as shown in FIG. 5.

As before, a resilient gasket 15 may be provided between the end extremity 46 of the porcelain casing and an abutment portion 42a of the end metallic closure plate 42.

Following the securement of the adapter ring 36 into place and the positioning of the gasket 15 into place, the mounting bolts 49 are inserted through the mounting holes and threadedly secured into the adapter ring 36 to maintain pressure upon the gasket 15. Following this operation the porcelain casing assembly is inverted and solder 13 is poured into the annular recess between the metallic band, or platinum band 6 and the inner surface of the solder ring 45, as shown in FIG. 5. A hermetic construction 35 consequently results.

Figure 6:
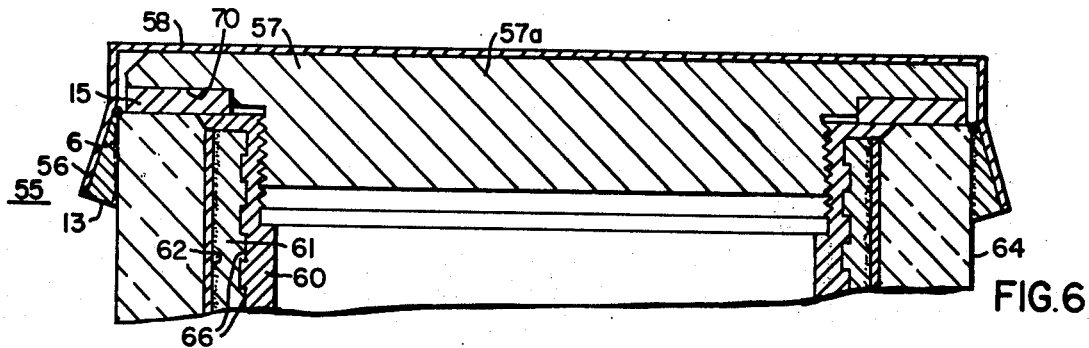
FIG. 6 fragmentarily illustrates a cross-sectional view of a modified-type of hermetic sealing construction in which the solder-ring extends externally of the end-cap closure-member, and the latter is threadedly secured to the inner-disposed adapter-ring which is babbitted to the sand-layer internally of the porcelain-casing structure; and, FIG. 7 illustrates a further modification of a hermetic sealing construction in which the solder-ring is affixed to the platinum-band of the end of the porcelain casing, and as a final operation, the end closure plate member is soldered to the surrounding platinum-band.

FIG. 6 shows an alternate form of construction 55 in which the solder ring 56 is brazed to the external exposed surface of the end closure plate 57, as at 58. The adapter ring 60 is affixed, as before, by a babbitted operation 61 to the internal sand-layer 62 of the porcelain casing 64. As shown in FIG. 6, the adapter ring 60 has a plurality of threads provided internally thereof, as at 66, to which is threadably secured a downwardly-extending extension 57a of the end closure plate 57. Again a gasket 15 is utilized compressing the end of the porcelain casing 64 against a shoulder portion 70 of the end metallic closure plate 57. As a final operation, the solder-ring 56 is affixed as by a solder-fillet 13 to the platinum band 6 previously formed on the end external surface of the porcelain casing 64.

In more detail with reference to FIG. 6 of the drawings, it will be observed that there is provided a glazed porcelain tube 64, the ends of which have sand bands provided on the inside and platinum bands provided on the outside, as indicated by the reference numerals 62 and 6 of FIG. 6. The ring-shaped adapter member 60, is attached to the internal bore at the ends of the porcelain tube by a layer of babbit metal 61 between the internal sand band and the outside grooved surface of the adapter ring 60, which, for example, may be fabricated of aluminum.

The end metallic closure plate 57 may have a threaded extension 57a which screws into the ring-shaped adapter member 60. The end closure member may also have a ring-shaped solder-ring 56 brazed to its outsde periphery, as shown in FIG. 6. Upon assembly, the closure plate 57 may be threaded into the adapter ring 60 with a gasket 15 interposed between the extremity of the porcelain casing and the closure plate 57, as shown in FIG. 6, and the closure plate screwed firmly against the gasket 15 being threaded into the inner surface of the ring-shaped adapter member 60. The solder ring 56 is then soldered to the porcelain tube by the solder filler, as indicated at 13.

Figure 7:
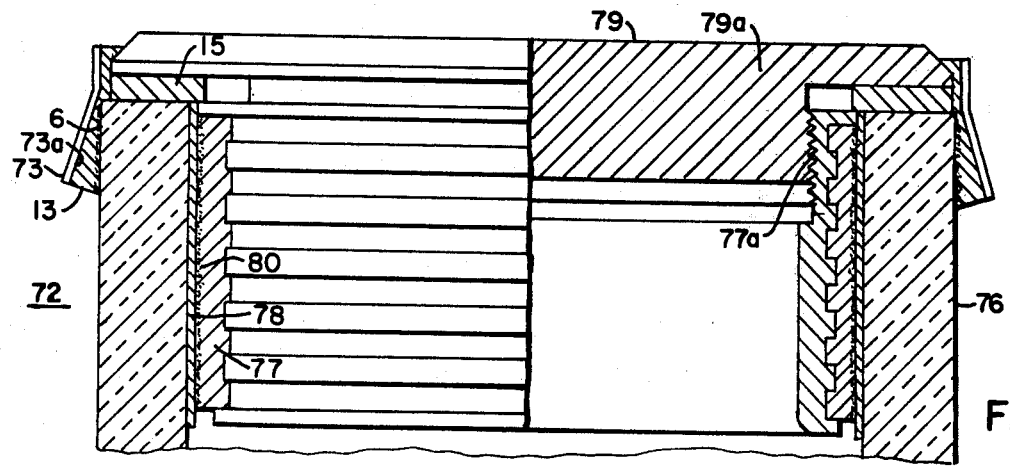

FIG. 7 illustrates still a further construction 72 in which the solder ring 73 is secured by a solder fillet 13 to the platinum band 6 of the end surface of the porcelain casing 76, as a preliminary operation. The internally-disposed adapter collar 77 is again babbitted at 78 to an internal sand-layer 80 provided internally of the casing 76. The adapter ring 77 has a plurality of threads 77a provided internally thereof, which are threadably engaged by a downwardly-extending portion 79a of the end closure plate 79. Again, as before, a resilient gasket 15 is employed being compressed, during the final threading operation of the end closure plate 79, into the adapter ring 77.

As a final operation, solder 13 is flowed around the end closure plate 79 between the outer periphery thereof and the inner surface 73a of the solder ring 73. As noted hereinbefore, the solder ring 73 was previously affixed by its solder-fillet 13 to the end of the porcelain casing 76 as a preliminary first operation.

With the construction illustrated in FIG. 7 of the drawings, it will be observed that in this modification of the invention, the solder-seal rings 73 are attached to the porcelain tube 76 at the metallized layer or platinum layer 6. The internal flange adapter rings 77 are secured as heretofore by babbit metal 78 against a sand band 80. The end metallic closure plate 79 may have an extension 79a which is threadedly secured fixedly into place against the adapter ring 77 with the gasket 15 interposed, as before, between a shoulder portion of the end metallic closure plate 79 and the extremity of the porcelain casing 76.

In this modification of the invention, however, following a tight threaded operation to compress the gasket 15, a ring of solder 13 is flowed between the solder-seal ring 73 and the outer periphery of the end metallic closure plate, as indicated by the reference numeral 13. Since this is a metal-to-metal joint, a hermetic seal is easily provided.

Although there have been illustrated and described specific hermetic sealing structures, it is to be clearly understood that the same were merely for the purpose of illustration, and that changes and modifications may readily be made therein by those skilled in the art, without departing from the spirit and scope of the invention.

I claim:

1. In combination, a porcelain casing having a sand band on the inner surface thereof adjacent one end thereof, said porcelain casing additionally having a platinum band on the outer surface thereof adjacent the end thereof, a metallic adapter-ring cemented internally of said hollow porcelain casing to said internally-located sand band, an end metallic closure plate having a metallic flanged solder-ring affixed thereto, means securing said end metallic closure plate to said internally-located adapter-ring, and the solder-ring being affixed by a hermetic solder-seal to said externally-located platinum band.

2. The combination according to claim 1, wherein the internally-located adapter-ring is babbitted to said sand band.

3. The combination according to claim 1, wherein an annular resilient gasket is located between the end surface of said porcelain casing and the end metallic closureplate.

4. The combination according to claim 1, wherein the end metallic closure-plate is threadedly secured to said internally-located adapter-ring.

5. In combination, a porcelain casing having a sand band on the outer surface thereof adjacent one end thereof, said porcelain casing additionally having a platinum band on the outer surface thereof adjacent the end external surface thereof, an outer-dispoed metallic adapter-ring cemented externally to said hollow porcelain casing to said externally-located sand band, an end relatively-heavy metallic closure plate having an annular metallic relatively thin flanged solder ring affixed thereto, means for removably clampingly securing said end metallic relatively-heavy closure plate to said externally-located adapter ring with the relatively-heavy metallic closure plate abutting the annular end of the porcelain casing, and the relatively thin solder-ring being affixed by a hermetic solder seal to the externally-located platinum-band provided adjacent the external end surface of the porcelain casing.

6. The combination according to claim 5, wherein one or more mounting bolts pass through openings provided in the relatively heavy end metallic closure-plate and are threaded into tapped openings provided in the adapter-ring.

7. The combination according to claim 5, wherein the adapter-ring is babbitted to the external sand band provided on the porcelain casing.

8. In combination, a porcelain casing having a sand band on the inner surface thereof adjacent one end thereof, said porcelain casing additionally having a platinum-band on the outer surface thereof adjacent one end thereof, a metallic adapter ring cemented internally of said hollow porcelain casing to said internally-located sand band, an end metallic closure plate having a metallic flanged solder-ring affixed thereto on the outer surface thereof, said end metallic closure-plate having a threaded portion which threads onto the internally-located adapter-ring, a gasket positioned between a shoulder portion of the end metallic closure-plate and the extremity of the porcelain casing, and the solder-ring being affixed by a hermetic solder seal to said externally-located platinum-band on the external end surface of the porcelain casing.

9. The combination according to claim 8, wherein the internally-located metallic adapter ring is babbitted to the sand band provided internally of the porcelain casing.

10. In combination, a porcelain casing having a sand band provided internally thereof and a platinum-band provided externally thereof, means for affixing a collar-like solder-ring to said platinum band by a solder fillet, means cementing an internally-located adapter collar having a threaded portion to the internally-located sand band of the porcelain casing, an end metallic closure-plate having an extension having a threaded connection with said internally-threaded adapter ring, annular gasket means interposed between the end of the porcelain casing and the shoulder portion of the end metallic closure-plate, and a solder fillet affixment between the periphery of the solder-ring and the outer periphery of the end metallic closure plate.

11. The combination according to claim 10, wherein the internal threaded adapter collar is babbitted to the internally-located sand band of the porcelain casing.

* * * * *